(12) United States Patent
Wolford et al.

(10) Patent No.: US 7,620,783 B2
(45) Date of Patent: Nov. 17, 2009

(54) METHOD AND APPARATUS FOR OBTAINING MEMORY STATUS INFORMATION CROSS-REFERENCE TO RELATED APPLICATIONS

(75) Inventors: Barry Joe Wolford, Cary, NC (US); James Edward Sullivan, Jr., Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 368 days.

(21) Appl. No.: 11/553,588

(22) Filed: Oct. 27, 2006

(65) Prior Publication Data
US 2007/0047378 A1 Mar. 1, 2007

Related U.S. Application Data

(63) Continuation-in-part of application No. 11/128,829, filed on May 13, 2005, now Pat. No. 7,230,876, and a continuation-in-part of application No. 11/165,950, filed on Jun. 23, 2005.

(60) Provisional application No. 60/653,020, filed on Feb. 14, 2005.

(51) Int. Cl.
*G06F 12/00* (2006.01)
(52) U.S. Cl. .................. 711/156; 711/154; 711/105; 711/106
(58) Field of Classification Search ........................ None
See application file for complete search history.

(56) References Cited

U.S. PATENT DOCUMENTS 5,787,255 A 7/1998 Parlan et al.
(Continued)

FOREIGN PATENT DOCUMENTS

EP 0797207 9/1997
(Continued)

OTHER PUBLICATIONS

Gillingham P et al:"SLDRAM:High Performance, Open-Standard Memory" IEEE Micro, IEEE Service Center, Los Alamitos, CA, US, vol. 17, No. 6, Nov. 1997, pp. 29-39, XP000726002 ISSN: 0272-1732 pp. 31-36.
(Continued)

*Primary Examiner*—Jack A Lane
(74) *Attorney, Agent, or Firm*—Nicholas J. Pauley; Sam Talpalatsky; Peter Kamarchik (57) ABSTRACT

In one embodiment taught herein, a memory module selectively uses its write data mask input as a status output on which it provides status signaling to an associated memory controller. The memory module configures its data mask input as a status output at one or more times not conflicting with write operations. Correspondingly, the memory controller configures its write data mask output as a status input at such times, for receipt of status signaling from the memory module. In one embodiment, the memory module maintains a status register related to one or more operating conditions of the module, such as temperature, and signals status information changes to the memory controller by driving the module's data mask input. In response to such signaling, the memory controller initiates a read of the module's status register to obtain updated status information, and takes appropriate action, such as by changing the module's refresh rate.

37 Claims, 5 Drawing Sheets

U.S. PATENT DOCUMENTS

| | | | |
|---|---|---|---|
| 6,373,768 B2 | 4/2002 | Woo et al. | |
| 6,401,213 B1 | 6/2002 | Jeddeloh | |
| 6,449,685 B1 | 9/2002 | Leung | |
| 6,453,218 B1 | 9/2002 | Vergis | |
| 6,667,905 B2 | 12/2003 | Dono et al. | |
| 6,728,798 B1 | 4/2004 | Roohparvar | |
| 6,757,857 B2 | 6/2004 | Lamb et al. | |
| 6,778,459 B2 | 8/2004 | Blodgett | |
| 6,937,958 B2 | 8/2005 | Gold et al. | |
| 6,957,308 B1 | 10/2005 | Patel | |
| 7,096,283 B2 | 8/2006 | Roohparvar | |
| 7,230,876 B2 | 6/2007 | Walker | |
| 7,251,192 B2 | 7/2007 | Walker | |
| 7,304,905 B2 * | 12/2007 | Hsu et al. | 365/212 |
| 7,395,176 B2 | 7/2008 | Chung et al. | |
| 7,421,525 B2 | 9/2008 | Polzin et al. | |
| 2002/0078282 A1 | 6/2002 | Drerup et al. | |
| 2003/0158696 A1* | 8/2003 | Gold et al. | 702/132 |
| 2005/0060481 A1 | 3/2005 | Bleonozink | |
| 2006/0239095 A1 | 10/2006 | Shi et al. | |
| 2006/0265615 A1* | 11/2006 | Janzen et al. | 713/300 |
| 2006/0294294 A1 | 12/2006 | Walker | |

FOREIGN PATENT DOCUMENTS

| | | |
|---|---|---|
| EP | 0851427 | 7/1998 |

OTHER PUBLICATIONS

International Preliminary Report on Patent Patentability-PCT/US06/006995-International Search Authority-European Patent Office-Aug. 14, 2007.

International Preliminary Examination Report-PCT/US06/024498, International Search Authority-European Patent Office-Dec. 24, 2007.

International Search Report-PCT/US06/006995, International Search Authority-European Patent Office-Oct. 30, 2006.

International Search Report-PCT/US06/024498, International Search Authority-European Patent Office-Apr. 10, 2007.

JEDEC Standard; "Double Data Rate (DDR) SDRAM Specification", JESD79E (May 2005).

Written Opinion-PCT/US06/006995-International Search Authority-European Patent Office-Oct. 30, 2006.

Written Opinion-PCT/US06/024498, International Search Authority-European Patent Office-Apr. 10, 2007.

* cited by examiner

METHOD AND APPARATUS FOR OBTAINING MEMORY STATUS INFORMATION CROSS-REFERENCE TO RELATED APPLICATIONS

CROSS-REFERENCE TO RELATED APPLICATIONS

This application claims priority under 35 U.S.C. § 120 as a continuation-in-part of the commonly owned, U.S. utility patent application filed on May 13, 2005 now U.S. Pat. No. 7,230,876 and identified by application Ser. No. 11/128,829, which in turn claims priority from the commonly owned U.S. provisional patent application filed on 14 Feb. 2005 and assigned Application Ser. No. 60/653,020, and further claims priority under 35 U.S.C. § 120 as a continuation-in-part of the commonly owned, co-pending U.S. utility patent application filed on Jun. 23, 2005 and identified by application Ser. No. 11/165,950. All such priority applications are expressly incorporated herein by reference.

BACKGROUND

1. Field of the Invention

The present invention relates generally to the field of memory and memory controllers, and in particular to obtaining status information from memory modules.

2. Relevant Background

Memory modules, such as Dynamic Random Access Memory (DRAM) memory modules, enjoy widespread use in contemporary electronic devices. In typical applications, a memory controller manages one or more memory modules. Commonly, plural arrangements of memory modules form potentially large banks of working memory with desired binary word widths, e.g., x16, x32, etc. In such contexts, current and evolving memory standards provide efficient, high-performance signal and interface definitions governing the design and implementation of memory modules, such as packaged or non-packaged ICs.

As a non-limiting example, industry-standard memory specifications for Double Data Rate (DDR) Synchronous DRAMs (SDRAMs) appear in revision JSED79E of the "Double Data Rate (DDR) SDRAM Specification," published by the JEDEC SOLID STATE TECHNOLOGY ASSOCIATION in May 2005. Related third-generation revisions of this standard are forthcoming. One may also refer to similar third generation standards for Graphics Double Data Rate (GDDR) memory modules.

Input/output signal definitions represent one standardization constraint of particular relevance when designers consider extending memory module functionality, or otherwise altering memory module operation. For example, as memory modules become increasingly sophisticated, they may require mode and other configuration settings information. Thus, it is now common for memory modules to include one or more mode registers, device identification registers, etc. Rather than requiring new signals and connections, the memory modules are configured to make these registers accessible to an associated memory controller via read/write operations that are similar to the read/write operations involving the stored data array(s) within the memory module.

For example, as taught in the co-pending priority applications identified earlier herein, it is known to incorporate a status register within a memory module that is readable by an associated memory controller. For example, the memory controller may retrieve status information from a memory module's status register by performing a synchronous read operation at a predefined memory address. As a non-limiting example, the status information may include temperature-related status information, such as refresh rate data identifying a temperature-dependent refresh rate period currently required by the memory module.

SUMMARY OF THE DISCLOSURE

One embodiment taught herein discloses a method of indicating status information from a memory module. The method comprises maintaining status information related to one or more operating conditions of the memory module in a status register readable by an associated memory controller, and signaling changes in the status information via a data mask input of the memory module. The memory module may be configured to signal the associated memory controller synchronously or asynchronously.

By way of non-limiting example, the memory module comprises an SDRAM module, and the data mask input comprises a Write Data Mask input pin of the SDRAM module. More generally, in one or more embodiments, the memory module comprises a data mask input for masking write data during write operations to the memory module by an associated memory controller, a status register readable by the associated memory controller, and one or more control circuits operatively associated with the status register and the data mask input. The one or more control circuits are configured to maintain status information related to one or more operating conditions of the memory module in the status register, and to signal changes in the status information via the data mask input.

As a further non-limiting example, the status information relates to memory module temperature, or to another refresh-related condition of the memory module. Additionally, or alternatively, the status information relates to stored data errors. To these ends, the one or more control circuits include, or are associated with, one or more detection circuits, such as temperature detectors and/or data error detectors. In one or more embodiments, for example, the memory module includes a temperature detection circuit and maintains temperature-related status information in its status register, relevant to the required memory refresh rate of the memory module. Further, the one or more control circuits of the memory module are configured to signal changes in the temperature-related information to the associated memory controller, or at least to signal those changes requiring a change in refresh rates. In turn, the memory controller is configured to detect the signaled change, read the status register, and change refresh rates if and as needed.

With the above in mind, one embodiment of a memory controller comprises an input/output circuit configurable as a data mask output for outputting a write data mask signal to the associated memory module during write operations, and configurable as a status input for receiving a status signal from the associated memory module. One or more control circuits of the memory controller are configured to control the input/output circuit, and configured to receive the status signal from the associated memory module. In at least one embodiment, the one or more control circuits are configured to initiate a read operation targeted to a status register of the memory module in response to detecting the status signal on the status input. In other embodiments, the one or more control circuits are configured to receive a synchronous status signal on the status input, such as during clocked read operations involving the memory module.

Of course, the present invention is not limited to the above features and advantages. Those skilled in the art will recognize additional features and advantages upon reading the following detailed description, and viewing the accompanying drawings.

DETAILED DESCRIPTION

Figure 1:
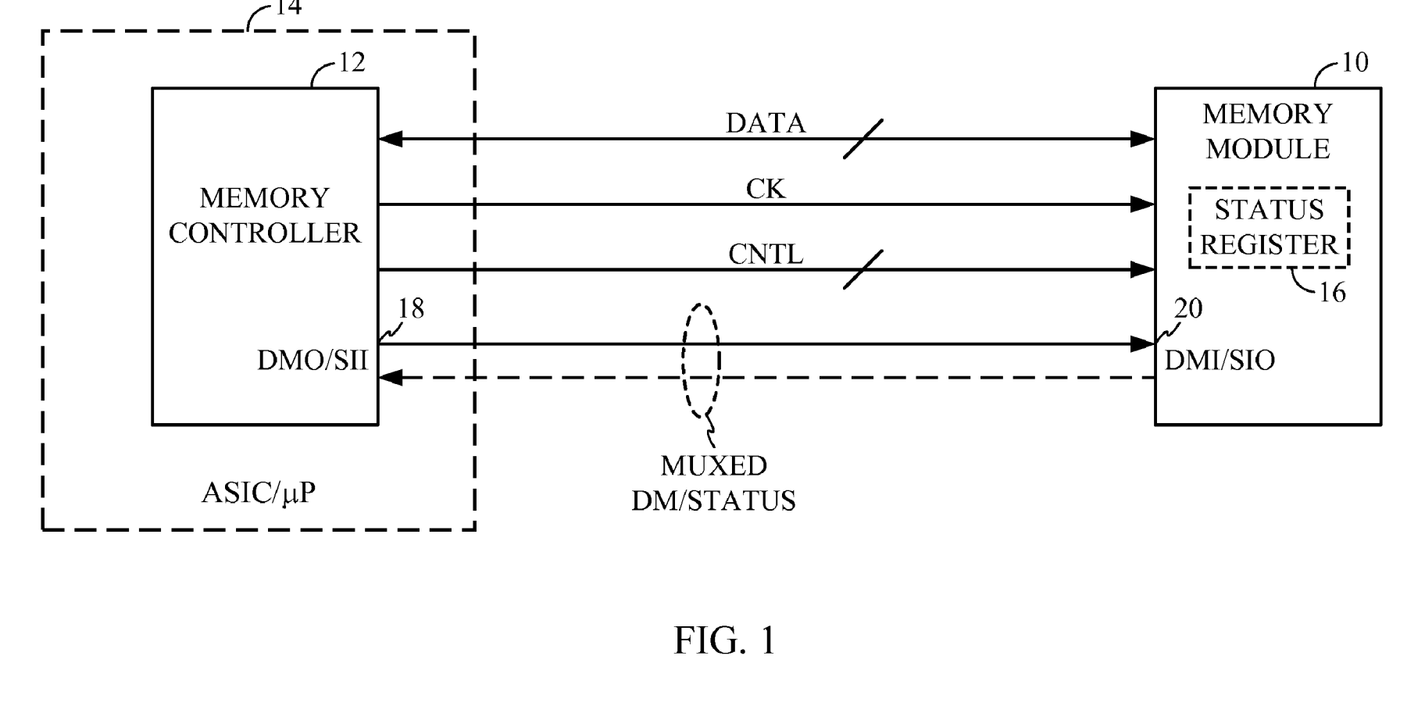
FIG. 1 is a block diagram of a memory controller and a memory module, each configured according to one embodiment of status information signaling as taught herein.

FIG. 1 at least partially illustrates a memory module 10 and an associated memory controller 12. As will be explained in detail later herein, the memory controller 12 includes a write data mask output 18 and the memory module 10 includes a corresponding write data mask input 20. The presence and use of this data mask (DM) output/input pair is, in one or more embodiments of the memory controller 12 and the memory module 10, governed by one or more industry standards that must be adhered to for standards compliance.

Nonetheless, as taught herein, the memory controller 12 is advantageously configured to use its data mask input 18 as a status information input, for receiving status signaling from the memory module 10. Correspondingly, the memory module 10 is advantageously configured to use its data mask input 20 as a status information output, which it uses for signaling status information to the memory controller 12. As such, in FIG. 1, the controller's data mask output 18 is labeled DMO/SII to denote its use as a write data mask output and as a status information input. Similarly, the module's data mask input 20 is labeled DMI/SIO to denote its complementary use as a write data mask input and as a status information output.

By way of non-limiting example, one may refer to the pin definitions in Table 2 of the DDR SDRAM specification promulgated by JEDEC as document number JESD79E. According to that document, the data mask (DM) pin is an input with respect to a compliant memory module, and allows a compliant memory controller selectively to mask data written into the memory module. Those skilled in the art will appreciate that data mask (DM) signals are defined identically or similarly in other memory standards, and are generally understood to be inputs with respect to memory modules for selectively masking write data.

With this broad applicability in mind, in one embodiment the memory module 10 comprises a DRAM module and the memory controller 12 correspondingly comprises a DRAM controller. More particularly, in one or more non-limiting embodiments, the memory module 10 comprises an SDRAM module, e.g., a DDR SDRAM module, and the memory controller 12 comprises an SDRAM controller. Also, note that the memory controller 12 may be configured as a standalone entity, or it may be incorporated within another entity 14, such as in an Application Specific Integrated Circuit (ASIC) or microprocessor (μP).

Figure 2:
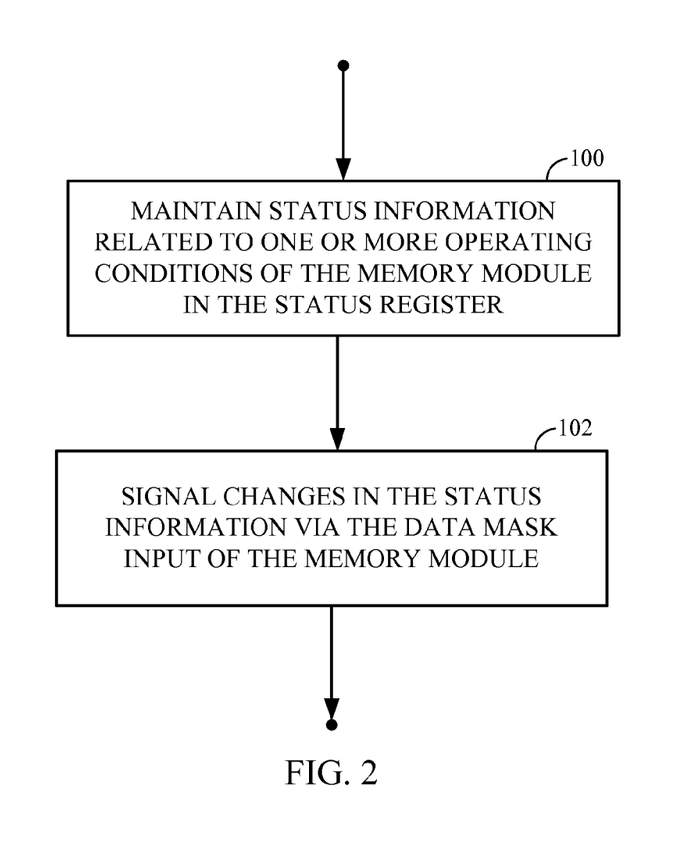
FIG. 2 is a logic flow diagram of one embodiment of memory module processing logic for sending status information signaling to a memory controller.
Figure 3:
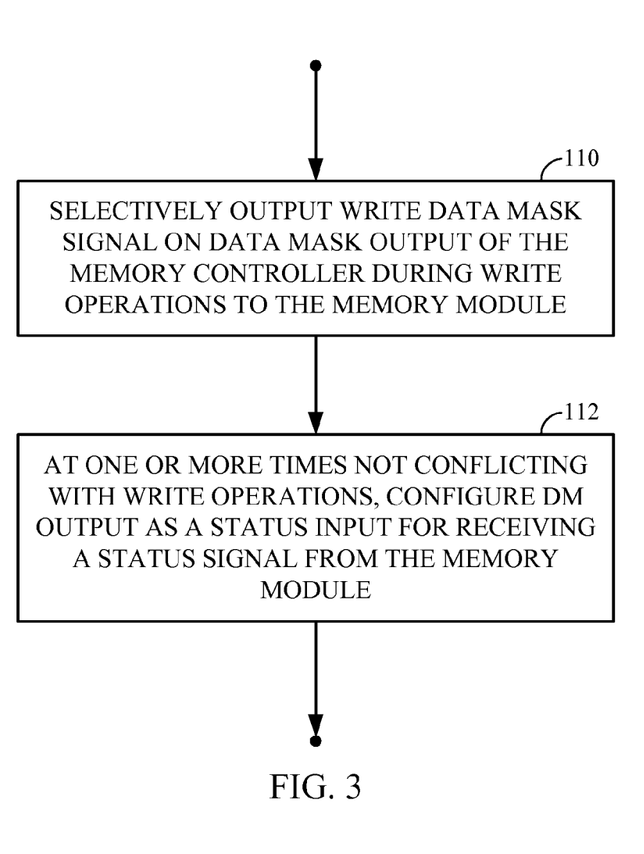
FIG. 3 is a logic flow diagram of one embodiment of memory controller processing logic for receiving status information signaling from a memory module.

FIGS. 2 and 3 illustrate one embodiment of memory module and memory controller processing logic, respectively, wherein the data mask input 20 to the memory module 10 is used selectively as a status output for signaling status information to the memory controller 12. It should be understood that the illustrated processing logic, and variations and extensions thereof, may be implemented in hardware, software, or any combination thereof. Thus, interface and control processing circuits conventionally included in memory modules and controllers may be adapted for the status information signaling operations taught herein.

Regarding the memory module processing illustrated in FIG. 2, processing "begins" with the memory module 10 maintaining status information in a status register 16, wherein the maintained status information relates to one or more operating conditions of the memory module 10 (Step 100). Such operating condition status information may include temperature-related status information, such as quantized temperature measurements and/or temperature-dependent refresh timing information. For example, the status register 16 may include data identifying the periodic refresh cycle timing that should be used by the memory controller 12 to maintain the integrity of stored data in the memory module 10. Additionally, or alternatively, the status register 16 may include error-related status information, such as flags or other data indicating the detection of data errors in data stored by the memory module 10.

Regardless of the particular type and variety of status information held in the memory module's status register 16, the memory module 10 is advantageously configured to signal changes in the status information via the data mask input 20 of the memory module (Step 102). As just one advantage of such signaling, the memory module 10 effectively can output an "interrupt" signal to the memory controller 12, indicating potentially important status information changes. For example, the memory controller 12 can, at one or more times not conflicting with write operation use of its data mask output 18, configure the data mask output 18 as a status input, and then simply monitor that status input for status signaling from the memory module 10. Interrupt-type status signaling may be used for temperature-related status changes. Additionally, or alternatively, interrupt-type signaling may be used to indicate detection stored-data errors by the memory module 10, such as where the memory module 10 is configured for background data integrity checking ("scrubbing") of the data stored in the module 10.

Of course, as explained herein, the memory module 10 may signal status information changes asynchronously or synchronously. Further, the memory module 10 may output actual status information via its data mask input 20, e.g., it may serially output status information as clocked data, or it may simply use change-of-state signaling to indicate status information.

In one general embodiment, the memory module 10 is configured according to a status information signaling method wherein it signals changes in module status information via the data mask input 20 by driving the data mask input 20 as a status output at one or more times not conflicting with write operations. Such times may comprise non-write times, i.e., any time other than an active write operation time, or it may avoid read operation times as well, e.g., the data mask input 20 is used as the status output at times not conflicting with write and read operations. Of course, some embodiments of the memory module 10 specifically are configured to output status information signaling during read operations.

Regardless, as noted, driving the data mask input 20 as a status output at one or more times not conflicting with write operations may comprise the memory module 10 asynchronously or synchronously driving the data mask input at one or more non-write times. In one embodiment, the memory module 10 is configured to synchronously drive the data mask input 20 at one or more non-write times by synchronously driving the data mask input 20 responsive to a clock signal applied to the memory module 10 by the associated memory controller 12 during one or more non-write times.

Complementing the memory module status signaling operations illustrated in FIG. 2, FIG. 3 illustrates one embodiment of memory controller processing logic. Processing "begins" with the memory controller 12 selectively outputting a write data mask signal on its data mask output 18 during write operations on an as-needed basis (Step 110). Note that this operation corresponds to conventional use of the data mask output 18, which is to provide write data mask signaling to the memory module 10 during active write operations.

Unconventionally, however, controller-related processing continues with, at one or more times not conflicting with write operations, configuring the data mask output 18 as a status input for receiving a status signal from the memory module 10 (Step 112). That is, at one or more times selected not to conflict with write operation data masking, the memory controller 12 configures its data mask output 18 as a status input, such that it can monitor for status-related signaling by the memory module 10. Correspondingly, the memory module 10 selectively drives its data mask input 20 as a status output at such times.

Figure 4:
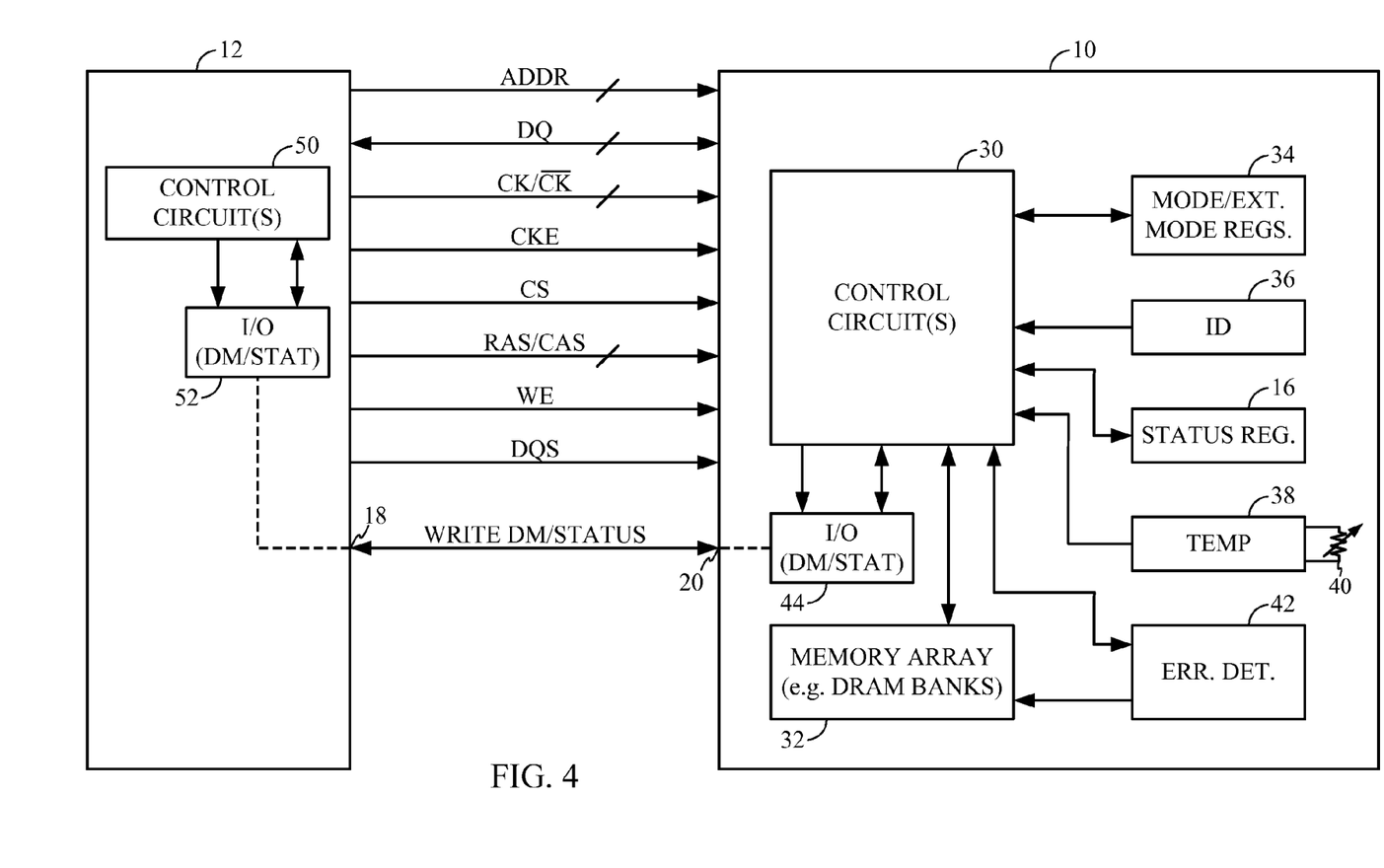
FIG. 4 is a block diagram of a memory controller and a memory module, each configured according to another embodiment of status information signaling as taught herein.

Turning from the above processing logic examples, FIG. 4 illustrates additional memory controller and memory module embodiments. In the illustrated embodiments, the memory controller 12 and the memory module 10 communicatively interface via a number of signal lines. The illustrated signal lines represent a non-limiting example presented for discussion purposes, and include address lines denoted as "ADDR," bi-directional data lines denoted as "DQ," clock lines denoted as "CK/CK bar," a clock enable line denoted as "CKE," a chip select line denoted as "CS," Row/Column Address Strobe lines denoted as "RAS/CAS," a write enable line denoted as "WE," and a data strobe line for double data rate operation, denoted as "DQS." Of more interest to the discussion herein, the signal lines include a write data mask (DM) signal line acting as an output from the memory controller 12 to the memory module 10, and also acting as a status output from the memory module 10 to the memory controller 12.

The memory module 10 includes one or more control circuits 30 that provide memory module interface controls, read/write command decoding etc. The memory module 10 further includes a memory array 32, which may comprise one or more banks of addressable memory for data storage, mode/extended mode registers 34, a vendor/device ID register 36, a temperature monitoring circuit 38 with an associated module temperature sensor 40, and a stored-data error detection circuit 42. Additionally, the memory module 10 includes an embodiment of the aforementioned status register 16.

To emphasize the dual-use, input/output configuration of the data mask input 20 of the memory module 10, FIG. 4 illustrates a bi-directional input/output circuit 44 associated with the data mask input 20. The control circuits 30 are operatively associated with the input/output circuit 44, such that the data mask input 20 can be configured as an input to receive the data mask signal from the memory controller 12, and configured as a status output for outputting status signaling to the memory controller 12. Note that in one or more embodiments, the input/output circuit 44 may comprise a transistor-based push-pull circuit, and may include passive or active pull-up/pull-down circuits to permit tri-state (high z) operation. It will be understood that, in general, the memory module 10 includes a number of signal line interfaces, in addition to the particularly illustrated input/output circuit 44.

Similarly, the memory controller 12 includes one or more control circuits 50 that are operatively associated with a number of signal line interface circuits, including an input/output circuit 52. The input/output circuit 52 allows the control circuits 50 to output a data mask signal as needed during write operations via the data mask output 18, and to re-configure the data mask output 18 as a status input for receiving status signaling from the memory module 10 at one or more times not conflicting with write operations.

Figure 5:
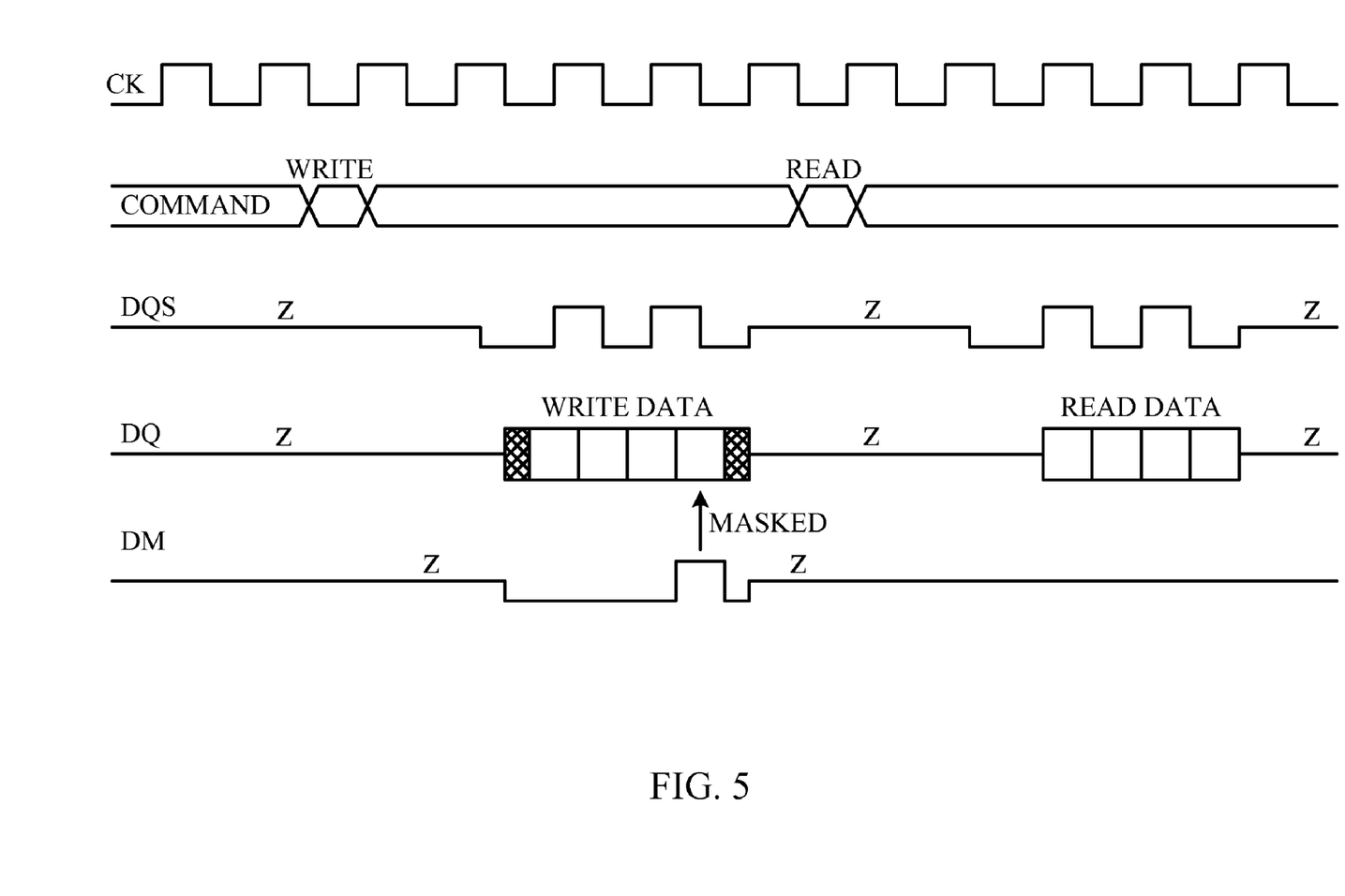
FIGS. 5 and 6 are timing diagrams for one or more embodiments of status information signaling as taught herein.

With the input/output flexibility of FIG. 4 in mind, FIG. 5 illustrates a signal timing diagram for example cases of write and read operations with no status information signaling on the DM signal line. Conversely, FIG. 6 illustrates similar operations, but shows one method of status information signaling via the DM signal line.

Thus, looking at FIG. 5, one sees a conventional usage of the data mask output 18 by the memory controller 12, as set in the context of a WRITE command, followed in the illustrated timing diagram by a READ command. In the diagram, the topmost trace represents the synchronous clock signal CK. In downward order, the subsequent traces are the COMMAND, DQS, DQ, and data mask (DM) signals.

One sees that the DM signal line is tri-stated until write data is driven onto the DQ signals by the memory controller 12 as part of the commanded write operation. At that point, the memory controller 12 drives the DM signal line low. The low state of the DM signal line means that the write data driven by the memory controller 12 onto the DQ signals is strobed into the memory module 10 responsive to the DQS signal. However, by transitioning the DM signal line to a high condition, the memory controller 12 prevents the last of the four illustrated data items (e.g., words) from being written into the memory module 10—i.e., the last data item is masked. One also sees the memory controller 12 returns DM to its low state, and then DM is tri-stated and remains unused during the subsequent READ command operations.

Figure 6:
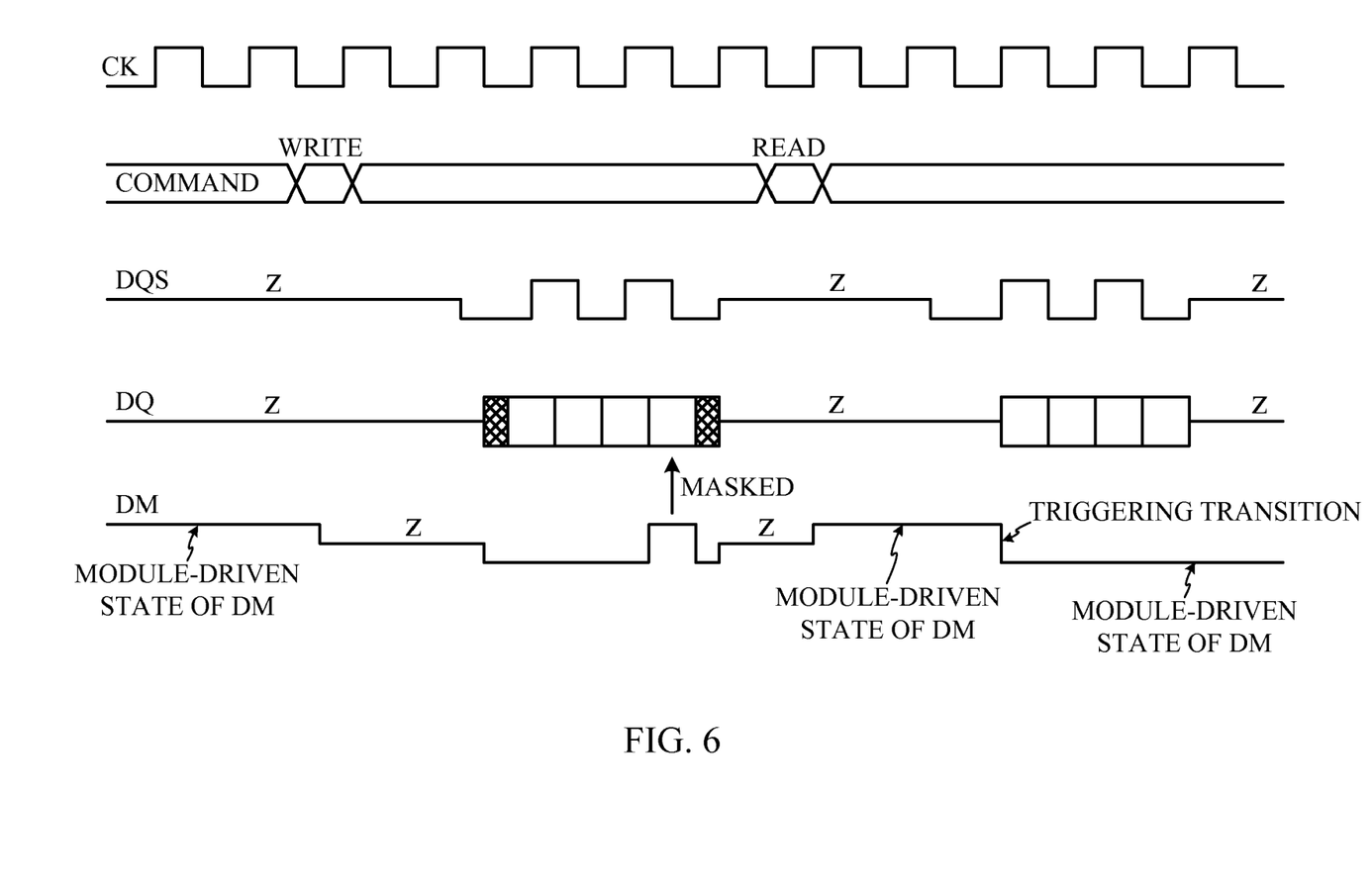

In contrast, the timing diagram of FIG. 6 illustrates a scenario wherein the memory module 10 drives the DM signal line to one or more defined logic states at times not conflicting with the illustrated write operation, for purposes of providing status information signaling to the memory controller 12. For example, assuming that a logic high condition denotes a given status information state, one sees that the memory module 10 drives the DM signal line high in the time before receiving the WRITE command from the memory controller 12. That is, before the WRITE command is received and decoded by the memory module 10, the memory module 10 configured its data mask input 20 as a status output and drove a high logic state on the status output. (Correspondingly, the memory controller 12 configured its data mask output 18 as a status input and monitored for status signaling on the DM signal line.)

Upon receipt of the WRITE command, the control circuits 30 of the memory module 10 reconfigure the module's data mask status input 20 for its conventional use as a data mask input, thereby allowing conventional write data mask use of the DM signal line by the memory controller 12. Likewise, the control circuits 50 of the memory controller 12 reconfigure its data mask output 18 for use in outputting write data mask signals as needed for write data masking control during the write operation. Thus, one sees the DM signal line go from its module-driven high state to a tri-state condition, and then to its controller-driven low and high states during the write operation.

After completion of the write operation, the memory controller 12 again configures its data mask output 18 as a status input, and the memory module 10 configures its data mask input 20 as a status output and resumes driving a high logic state on the status output. By resuming the high-state drive of the DM signal line, the memory module 10 implicitly signals to the memory controller 12 that no status information changes occurred during the write operation, or at least that no status information changes necessitating a read of the status register 16 occurred during that time. Thus, by subsequently changing the driven logic level from high to low, shown in the diagram as a "triggering transition," the memory module 10 effectively provides an "interrupt-type" signal to the memory controller 12, indicating that the memory controller 12 should initiate a read of the module's status register 16.

The above operation illustrates an interrupt-type, asynchronous signaling embodiment, wherein the memory module 10 drives the DM signal line at a given logic state at times not conflicting with write operations, and changes the driving logic level as needed, to indicate to the memory controller 12 that it should retrieve status information from the memory module's status register 16. For example, in one embodiment the memory module 10 is configured to drive a given logic level on the status output—at given non-write times—until the module's temperature changes to an extent warranting a change in the memory refresh rate. At that point, the memory module 10 changes the logic level it uses (or will use) to drive the data mask input 20 as a status output. Correspondingly, the memory controller 12 is configured to recognize the change-of-state status signaling as an indication that it should retrieve temperature-related status information from the memory module 10, for purposes of adjusting as needed the memory refresh rate used for the memory module 10.

Of course, the above example is non-limiting. In another embodiment, the memory module 10 is configured for synchronous status information signaling, although that embodiment also may advantageously use asynchronous signaling for interrupt-type signaling of status information changes. As one non-limiting example of synchronous status information signaling, the one or more control circuits 50 of the memory controller 12 are configured to operate the input/output circuit 52 as a status input during a read operation, and are further configured to synchronously receive status information from the memory module 10 on the status input during the read operation.

More particularly, in at least one embodiment, the memory module 10 outputs change-of-state signaling and/or serial data signaling via its data mask input 20, during read operations. For example, the error detection circuit 42 of the memory module 10 may be configured to detect memory errors—e.g., parity check and/or Cyclic Redundancy Code (CRC) errors—associated with data stored in the memory array 32, and to provide error information to the control circuits 50. In turn, the control circuits 50 may maintain error flags and/or detailed error detection information in the status register 16. Changes in error-related status information can be indicated to the memory controller 12 during read operations by change-of-state signaling, or by outputting serial status information data responsive to the clock signal applied to the memory module 10 by the memory controller 12 during read operations.

More generally, it should be understood that the memory controller 12 is configured to obtain status information from the memory module 10 according to synchronous and/or asynchronous signaling. To that end, the memory controller 12 includes the input/output circuit 52, which is configurable as a data mask output for outputting a write data mask signal to the memory module 10 during write operations. Further, the input/output circuit 52 is configurable as a status input for receiving a status signal from the memory module 10 at one or more times not conflicting with write operations. Thus, the one or more control circuits 50 of the memory controller 12 are configured to control the input/output circuit 52 accordingly, and to receive the status signaling (e.g., a status signal) from the memory module 10.

In at least one embodiment, the one or more control circuits 50 are configured to initiate a read operation targeted to the status register 16 of the memory module 10 in response to detecting the status signal from the memory module 10 on the status input of the memory controller 12. Status register reads, for example, may be triggered by logic state changes in the status signal output by the memory module 10.

Further, in at least one embodiment, the status signal indicates changes in refresh-related status information. In such embodiments, the one or more control circuits 50 are configured to initiate a read operation directed to the status register 16 of the memory module 10, wherein the status register 16 holds refresh-related status information. Further, the one or more control circuits 50 are configured to change refresh settings for the memory module 10 in dependence on the refresh-related status information. Such information may comprise data identifying refresh cycle times, or may comprise temperature data, which may be quantized into a plurality of ranges, such that each indicated temperature range can be mapped to a corresponding refresh rate requirement by the memory controller 12.

Of course, those skilled in the art will appreciate that essentially any type of status information may be maintained by the memory module 10 in its status register 16, and that changes in one or more status items advantageously are signaled to the memory controller 12 by the memory module 10. For such signaling, which may be synchronous or asynchronous, the memory module 10 drives its data mask input 20 as a status output at one or more times not conflicting with write operations.

Accordingly, system efficiency is increased. That is, rather than the memory controller 12 being obligated to read the memory module's status register 16 repeatedly to maintain updated status information, status information can be signaled to the memory controller 12 by the memory module 10. More particularly, the memory module 10 drives its data mask input 20 as a status output at one or more non-write times, and by the memory controller 12 correspondingly monitors its data mask output 18 as a status input, during such times. Signaling can be, for example, change-of-state, interrupt-type signaling, or synchronous or asynchronous data output (e.g., serial data out).

With the above examples in mind, those skilled in the art will appreciate that the present invention is not limited by the foregoing discussion, or by the accompanying illustrations. Indeed, the present invention is limited only by the following claims, and their legal equivalents.

What is claimed is:

1. A method of indicating status information from a memory module comprising:
   maintaining status information related to one or more operating conditions of the memory module in a status register readable by an associated memory controller;
   signaling data mask information via a data mask input of the memory module; and
   signaling changes in the status information via the data mask input of the memory module.

2. The method of claim 1, wherein signaling changes in the status information via a data mask input of the memory module comprises driving the data mask input as a status output at one or more times not conflicting with write operations.

3. The method of claim 2, wherein driving the data mask input as a status output at one or more times not conflicting with write operations comprises asynchronously driving the data mask input at one or more non-write times.

4. The method of claim 2, wherein driving the data mask input as a status output at one or more times not conflicting with write operations comprises synchronously driving the data mask input at one or more non-write times.

5. The method of claim 4, wherein synchronously driving the data mask input at one or more non-write times comprises synchronously driving the data mask input responsive to a clock signal applied to the memory module by the associated memory controller during one or more non-write times.

6. The method of claim 1, wherein maintaining status information related to one or more operating conditions of the memory module in a status register readable by an associated memory controller comprises maintaining temperature-related status information in the status register.

7. The method of claim 6, wherein signaling changes in the status information via a data mask input of the memory module comprises providing an interrupt-type signal to the associated memory controller via the data mask input at one or more times not conflicting with write operations in response to changes in the temperature-related status information.

8. The method of claim 6, wherein signaling changes in the status information via a data mask input of the memory module comprises asynchronously signaling the associated memory controller via the data mask input regarding changes in the temperature-related status information at one or more times not conflicting with write operations.

9. The method of claim 1, wherein maintaining status information related to one or more operating conditions of the memory module in a status register readable by an associated memory controller comprises maintaining stored data error-related status information in the status register.

10. The method of claim 9, wherein signaling changes in the status information via a data mask input of the memory module comprises providing an interrupt-type signal to the associated memory controller via the data mask input at one or more times not conflicting with write operations in response to changes in the stored data error-related status information.

11. The method of claim 9, wherein signaling changes in the status information via a data mask input of the memory module comprises synchronously signaling the associated memory controller via the data mask input regarding changes in the stored data error-related status information responsive to a clock signal applied to the memory module by the memory controller during read operations.

12. The method of claim 1, wherein maintaining status information related to one or more operating conditions of the memory module in a status register readable by an associated memory controller comprises maintaining refresh-related status information, and wherein signaling changes in the status information via a data mask input of the memory module comprises asynchronously signaling the associated memory controller regarding changes in the refresh-related status information by driving the data mask input as a status output at one or more times not conflicting with write operations.

13. The method of claim 1, wherein the memory module comprises a Synchronous Dynamic Random Access Memory (SDRAM) module, and wherein the data mask input comprises a Write Data Mask input pin of the SDRAM module.

14. A memory module comprising:
a data mask input for masking write data during write operations to the memory module by an associated memory controller;
a status register readable by the associated memory controller; and
one or more control circuits operatively associated with the status register and the data mask input;
said one or more control circuits configured to maintain status information related to one or more operating conditions of the memory module in the status register, and to signal changes in the status information via the data mask input.

15. The memory module of claim 14, wherein the data mask input is selectively configurable as an output, and wherein the one or more control circuits are configured to signal changes in the status information via the data mask input by driving the data mask input as a status output at one or more times not conflicting with write operations.

16. The memory module of claim 15, wherein the one or more control circuits are configured to drive the data mask input as a status output at one or more times not conflicting with write operations by asynchronously driving the data mask input at one or more non-write times.

17. The memory module of claim 15, wherein the one or more control circuits are configured to drive the data mask input as a status output at one or more times not conflicting with write operations by synchronously driving the data mask input at one or more non-write times.

18. The memory module of claim 17, wherein the one or more control circuits are configured to synchronously drive the data mask input at one or more non-write times by synchronously driving the data mask input responsive to a clock signal applied to the memory module by the associated memory controller during one or more non-write times.

19. The memory module of claim 14, wherein the one or more control circuits are configured to maintain status information related to one or more operating conditions of the memory module in the status register by maintaining temperature-related status information in the status register.

20. The memory module of claim 19, wherein the one or more control circuits are configured to signal changes in the status information via the data mask input by providing an interrupt-type signal to the associated memory controller via the data mask input at one or more times not conflicting with write operations in response to changes in the temperature-related status information.

21. The memory module of claim 19, wherein the one or more control circuits are configured to signal changes in the status information via the data mask input by asynchronously signaling the associated memory controller via the data mask input regarding changes in the temperature-related status information at one or more times not conflicting with write operations.

22. The memory module of claim 14, wherein the one or more control circuits are configured to maintain status information related to one or more operating conditions of the memory module in the status register by maintaining stored data error-related status information in the status register.

23. The memory module of claim 22, wherein the one or more control circuits are configured to signal changes in the status information via the data mask input by providing an interrupt-type signal to the associated memory controller via the data mask input at one or more times not conflicting with write operations in response to changes in the stored data error-related status information.

24. The memory module of claim 22, wherein the one or more control circuits are configured to signal changes in the status information via the data mask input by synchronously signaling the associated memory controller via the data mask input regarding changes in the stored data error-related status information responsive to a clock signal applied to the memory module by the memory controller during read operations.

25. The memory module of claim 14, wherein the one or more control circuits are configured to maintain status information related to one or more operating conditions of the memory module in the status register by maintaining refresh-related status information in the status register, and wherein the one or more control circuits are configured to signal changes in the status information via the data mask input by asynchronously signaling the associated memory controller regarding changes in the refresh-related status information by driving the data mask input as a status output at one or more times not conflicting with write operations.

26. The memory module of claim 14, wherein the memory module comprises a Synchronous Dynamic Random Access Memory (SDRAM) module, and wherein the data mask input comprises a Write Data Mask input pin of the SDRAM module.

27. In a memory controller, a method of monitoring for status information from an associated memory module comprising:
    selectively outputting a write data mask signal on a data mask output of the memory controller during write operations to the memory module; and
    at one or more times not conflicting with the write operations, configuring the data mask output as a status input for receiving a status signal from the memory module.

28. The method of claim 27, further comprising initiating a read operation targeted to a status register of the memory module in response to detecting the status signal on the status input.

29. The method of claim 27, wherein configuring the data mask output as a status input for receiving a status signal from the memory module comprises configuring the data mask output as status input during a read operation, and further comprising synchronously receiving status information from the memory module on the status input during the read operation.

30. The method of claim 27, wherein configuring the data mask output as a status input for receiving a status signal from the memory module comprises configuring the data mask output as status input during one or more non-write times, and further comprising monitoring for status signal changes during the one or more non-write times.

31. The method of claim 30, further comprising initiating a status register read responsive to detecting a status signal change.

32. A memory controller for controlling an associated memory module, the memory controller comprising:
    an input/output circuit configurable as a data mask output for outputting a write data mask signal to the associated memory module during write operations, and configurable as a status input for receiving a status signal from the associated memory module; and
    one or more control circuits configured to control the input/output circuit, and configured to receive the status signal from the associated memory module.

33. The memory controller of claim 32, wherein the one or more control circuits are configured to initiate a read operation targeted to a status register of the memory module in response to detecting the status signal on the status input.

34. The memory controller of claim 32, wherein the one or more control circuits are configured to operate the input/output circuit as the status input during a read operation, and are further configured to synchronously receive status information from the memory module on the status input during the read operation.

35. The memory controller of claim 32, wherein the one or more control circuits are configured to operate the input/output circuit as the status input during one or more non-write times, such that use of the input/output circuit as a status input does not conflict with write operations, and are further configured to monitor the status input for status signal changes during the one or more non-write times.

36. The memory controller of claim 35, wherein the one or more control circuits are configured to initiate a read operation directed to a status register of the memory module responsive to detecting a status signal change.

37. The memory controller of claim 32, wherein the status signal indicates changes in refresh-related status information and wherein the one or more control circuits are configured to initiate a read operation directed to a status register of the memory module that holds refresh-related status information, and wherein the one or more control circuits are configured to change refresh settings for the associated memory module in dependence on the refresh-related status information.

* * * * *